(12) United States Patent
Mueller et al.

(10) Patent No.: US 9,632,163 B2
(45) Date of Patent: Apr. 25, 2017

(54) METHOD AND SYSTEM FOR CALIBRATING A SHUNT RESISTOR

(75) Inventors: Bernd Mueller, Reutlingen (DE); Thomas Wieja, Gomaringen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 437 days.

(21) Appl. No.: 14/125,404

(22) PCT Filed: May 16, 2012

(86) PCT No.: PCT/EP2012/059099
§ 371 (c)(1),
(2), (4) Date: Mar. 12, 2014

(87) PCT Pub. No.: WO2013/000621
PCT Pub. Date: Jan. 3, 2013

(65) Prior Publication Data
US 2014/0184199 A1    Jul. 3, 2014

(30) Foreign Application Priority Data

Jun. 29, 2011 (DE) .......... 10 2011 078 334

(51) Int. Cl.
*G01R 35/00* (2006.01)
*G01R 1/20* (2006.01)

(52) U.S. Cl.
CPC ........... *G01R 35/005* (2013.01); *G01R 1/203* (2013.01)

(58) Field of Classification Search
None
See application file for complete search history.

(56) References Cited

U.S. PATENT DOCUMENTS 6,148,502 A * 11/2000 Gerber ................ H01C 17/242
29/610.1
6,489,881 B1   12/2002 Aleksandravicius et al.
(Continued)

FOREIGN PATENT DOCUMENTS

DE   103 10 503   9/2004
EP   0 265 076   4/1988
(Continued)

OTHER PUBLICATIONS

International Search Report for PCT/EP2012/059099, issued on Sep. 5, 2012.

*Primary Examiner* — Paresh Patel
(74) *Attorney, Agent, or Firm* — Gerard Messina (57) ABSTRACT

A shunt resistor includes: two measuring terminals for applying a measuring current flowing through the shunt resistor along a main flow direction; slot structures dividing the shunt resistor along the main flow direction to include two side flow areas of respective first widths and a main flow area of a second width; and two calibration terminals connected to the side flow areas. A circuit connected to the measuring terminals is designed to detect, and generate a signal based on, a measuring current flowing through the shunt resistor. A calibration device connected to the calibration terminals is designed to apply a reference voltage or current to the calibration terminals, and ascertain a calibration voltage based on a falling voltage across those terminals. A correction circuit connected to the calibration device and the detection circuit is designed to correct the signal generated by the detection circuit based on the detected calibration voltage.

10 Claims, 12 Drawing Sheets

(56) References Cited

U.S. PATENT DOCUMENTS

| | | | |
|---|---|---|---|
| 7,023,217 B1 | 4/2006 | Wong | |
| 7,300,807 B2 * | 11/2007 | Coolbaugh | H01L 27/0802 257/538 |
| 7,714,694 B2 * | 5/2010 | Landsberger | H01C 17/232 29/610.1 |
| 8,432,247 B2 * | 4/2013 | Wang | H01L 27/0288 338/195 |
| 2003/0020592 A1 | 1/2003 | Hirasawa | |
| 2011/0033985 A1 | 2/2011 | Udompanyavit et al. | |

FOREIGN PATENT DOCUMENTS

| | | |
|---|---|---|
| EP | 1 607 753 | 12/2005 |
| EP | 2 169 412 | 3/2010 |

* cited by examiner

Fig. 10b

METHOD AND SYSTEM FOR CALIBRATING A SHUNT RESISTOR

FIELD OF THE INVENTION

The present invention relates to methods and systems for calibrating a shunt resistor, in particular a metallic shunt resistor.

BACKGROUND

In conventional control processes, measurement of the current to be controlled is necessary. The current is usually measured indirectly as voltage across a measuring shunt or shunt resistor through which the current to be measured flows. The measuring current may then be deduced from the relationship of the measured voltage and the resistance of the shunt resistor through which current flows. Precise knowledge of the resistance value of the shunt resistor is of critical importance for the precision of the current measurement.

Shunt resistors are frequently used whose resistance tolerance is small enough for the current that is to be measured, and whose temperature dependency in the ideal case is zero or at least follows a known distribution. In the latter case, the voltage measured at the shunt resistor may be corrected according to the known temperature dependency. For example, the measured voltage may be corrected using a reference voltage which has the same known temperature dependency as the shunt resistor.

The reference voltage may be determined, for example, prior to initial start-up of the shunt resistor, and may be preconfigured as a reference in the measuring apparatus. However, the resistance value of metallic shunt resistors in particular may change over the course of operation, for example due to material aging. Since this material aging may be a function, among other factors, of the unknown current flow through the shunt resistor prior to initial start-up, a one-time preconfiguration of the measuring apparatus using a reference curve may not characterize the material aging.

It is known from U.S. Pat. App. Pub. No. 2011/0033985 to provide a shunt resistor whose resistance has a slight temperature dependency on an integrated circuit, it being possible to calibrate the shunt resistor using components of the integrated circuit.

SUMMARY

According to an example embodiment of the present invention, a shunt resistor includes two measuring terminals for applying a measuring current which flows through the shunt resistor along a main flow direction, slot structures which divide the shunt resistor along the main flow direction into two side flow areas, each being of a first width, and a main flow area of a second width, and two calibration terminals which are connected to the side flow areas transversely with respect to the main flow direction. This shunt resistor offers the advantage that the side flow areas are characterized by more high-resistance calibration resistances which in particular are of higher resistance than the shunt resistor along the main flow direction, through which a calibration signal of low current intensity may be conducted, so that the actual current measurement through the main flow area is not adversely affected. At the same time, the side flow areas are practically identical to the main flow area with regard to temperature dependency, material aging, and current flow-related change in resistance, so that the changes in the resistance in the main flow area may be deduced from the characteristics of the resistance measured in the side flow areas. This information can advantageously be used to precisely correct the current measurements in the main flow area with regard to temperature dependency, material aging, and current flow-related change in resistance, during operation of the shunt resistor.

According to an example embodiment of the present invention, a system for detecting a measuring current includes a shunt resistor as described, a detection circuit which is connected to the measuring terminals of the shunt resistor and which is designed to detect a measuring current flowing through the shunt resistor and to generate a measuring signal as a function of the detected measuring current, a calibration device which is connected to the calibration terminals and which is designed to apply a reference voltage or a reference current to the two calibration terminals, and to ascertain a calibration voltage as a function of a falling voltage across the two calibration terminals, and a correction circuit which is connected to the calibration device and the detection circuit, and which is designed to correct the measuring signal generated by the detection circuit as a function of the detected calibration voltage.

One option for designing the calibration device includes a direct current source which is connected to the calibration terminals of the shunt resistor, and an operational amplifier which is designed to detect a falling direct current voltage across the calibration terminals and to generate the calibration voltage therefrom. This offers the advantage of ascertaining the changes in resistance in the side flow areas of the shunt resistor using a direct current of low current intensity, without distorting the measuring current.

This option can be designed using an alternating current source instead of a direct current source. Assuming a suitable frequency for the impressed alternating current, this can have the advantage that the average value of the current flowing in the side flow areas is not changed by the current which is impressed for the calibration, regardless of the intensity of the impressed current. As a result, there is no change in the aging behavior in these paths compared to the main flow area.

One option for designing the calibration device includes an alternating voltage source which is designed to act on the calibration terminals with a reference alternating voltage, two capacitors which are each connected to one of the two calibration terminals, two resistors which are each coupled between the two capacitors and a ground terminal, and an operational amplifier which is designed to tap a voltage difference between the two nodes between the two capacitors and the two resistors, and to generate the calibration voltage therefrom. The capacitors can cooperate with the resistors of the side flow areas of the shunt resistor as a high pass filter, the limiting frequency of which is a function of the resistance values of the side flow areas of the shunt resistor. By ascertaining the voltage transfer through the high pass filter at a known impressed alternating voltage, the change in the resistance values of the side flow areas of the shunt resistor may be deduced via the change in the limiting frequency.

Another option for designing the calibration device includes a ring oscillator which is connected to the calibration terminals, and which is designed to generate a calibration voltage which includes an alternating voltage and whose frequency is a function of the resistance in the side flow areas of the shunt resistor. The oscillation frequency of the ring oscillator is a function of the resistance values of the side flow areas of the shunt resistor. The change in the resistance values of the side flow areas of the shunt resistor can in turn be deduced via the change in the oscillation frequency of the ring oscillator.

According to an example embodiment, in each case a reference calibration device can be provided whose components are structurally identical or the same as those of the calibration device. The reference calibration device can be connected to a reference shunt resistor which is similar to the shunt resistor, but through which no measuring current flows. Influences which are not caused by a measuring current-related change in resistance or material aging can thus be advantageously ascertained from the comparison of the calibration voltage of the calibration device and the reference calibration device.

According to an example embodiment of the present invention, a method for detecting a measuring current includes: detecting a measuring current flowing through a shunt resistor as described, generating a measuring signal as a function of the detected measuring current, applying a reference voltage or a reference current to the calibration terminals of the shunt resistor, detecting a falling voltage across the two calibration terminals, generating a calibration voltage from the falling voltage across the two calibration terminals, and correcting the measuring signal as a function of the calibration voltage for ascertaining a corrected measuring current through the shunt resistor.

Further features and advantages of specific embodiments of the present invention result from the following description, with reference to the appended drawings.

DETAILED DESCRIPTION

Figure 1A:
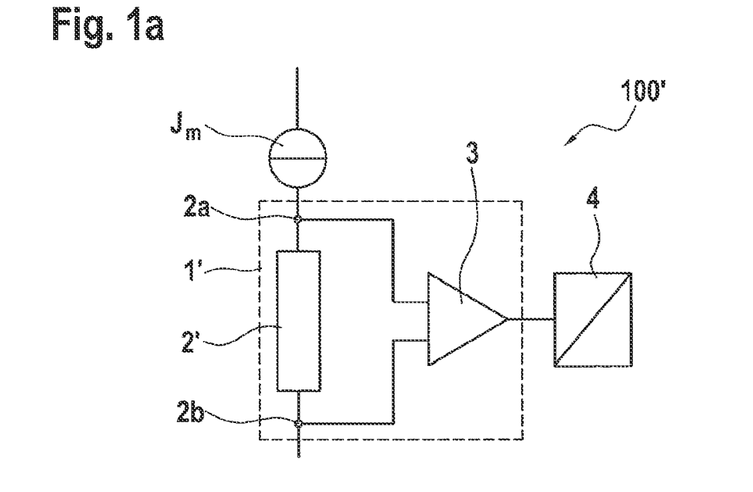
FIG. 1a shows a schematic illustration of a system for detecting a measuring current according to an example embodiment of the present invention.

FIG. 1a shows a schematic illustration of a system 100' for detecting a measuring current $J_m$. A shunt resistor 2' has two measuring terminals 2a and 2b situated at opposite sides of shunt resistor 2'. A voltage which is a function of measuring current $J_m$ and the resistance value of shunt resistor 2' may be tapped at these measuring terminals 2a and 2b. An operational amplifier 3 which detects the falling voltage across shunt resistor 2' and outputs a measuring signal may be situated in a measuring circuit 1'. The measuring signal may be converted into a digital measuring signal in an analog-to-digital converter (ADC) 4, for example.

Figure 1B:
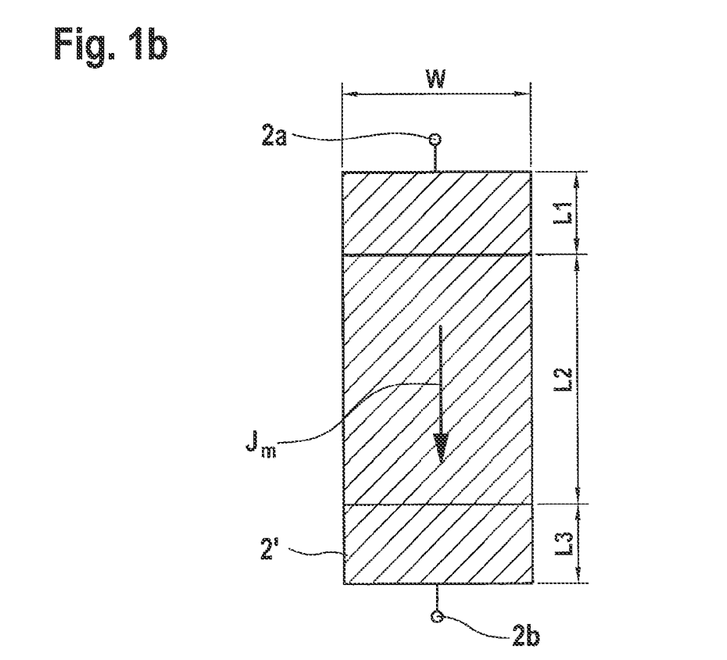
FIG. 1b shows a schematic illustration of a shunt resistor which is used in the system shown in FIG. 1a, according to an example embodiment of the present invention.

FIG. 1b shows a schematic illustration of an example shunt resistor 2' which is used in system 100' of FIG. 1a. Current $J_m$ flows through shunt resistor 2' along a main flow direction. The length of shunt resistor 2' along the main flow direction is L=L1+L2+L3, L2 being at a middle area and being between, and longer than each of, two edge areas L1 and L3. Shunt resistor 2' is of width W. Shunt resistor 2' can be made completely of metal, for example, and can include the same material in all areas.

Figure 2A:
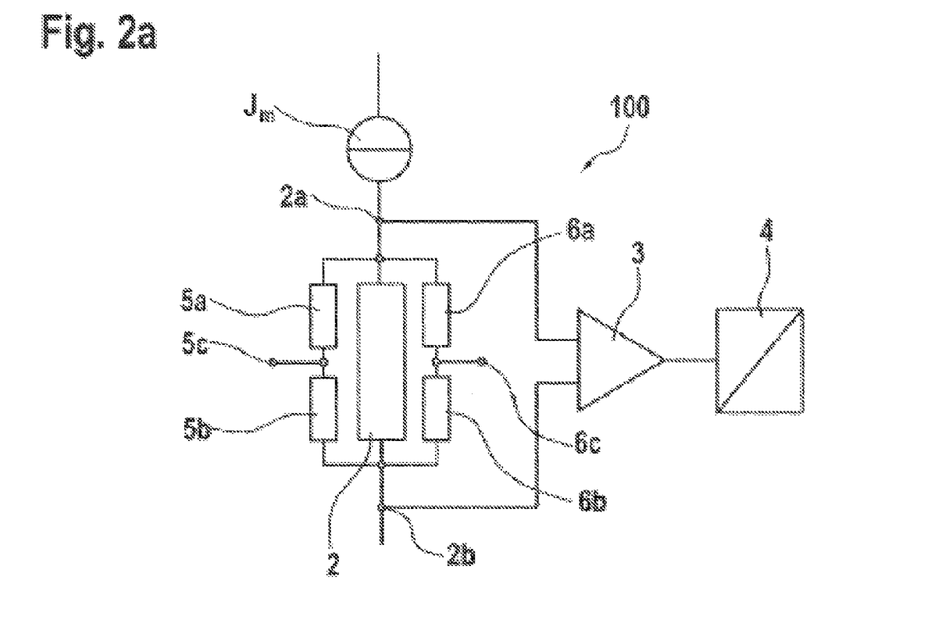
FIG. 2a shows a schematic illustration of a system for detecting a measuring current according to an example embodiment of the present invention.

FIG. 2a shows a schematic illustration of a system 100 for detecting a measuring current $J_m$, according to an example embodiment. Two measuring terminals 2a and 2b are situated at opposite sides of a shunt resistor 2. A voltage, which is a function of measuring current $J_m$ and the resistance value of shunt resistor 2, can be tapped at these measuring terminals 2a and 2b. An operational amplifier 3 can detect the falling voltage across shunt resistor 2 and can output a measuring signal which can be converted into a digital measuring signal in an analog-to-digital converter (ADC) 4, for example.

Figure 2B:
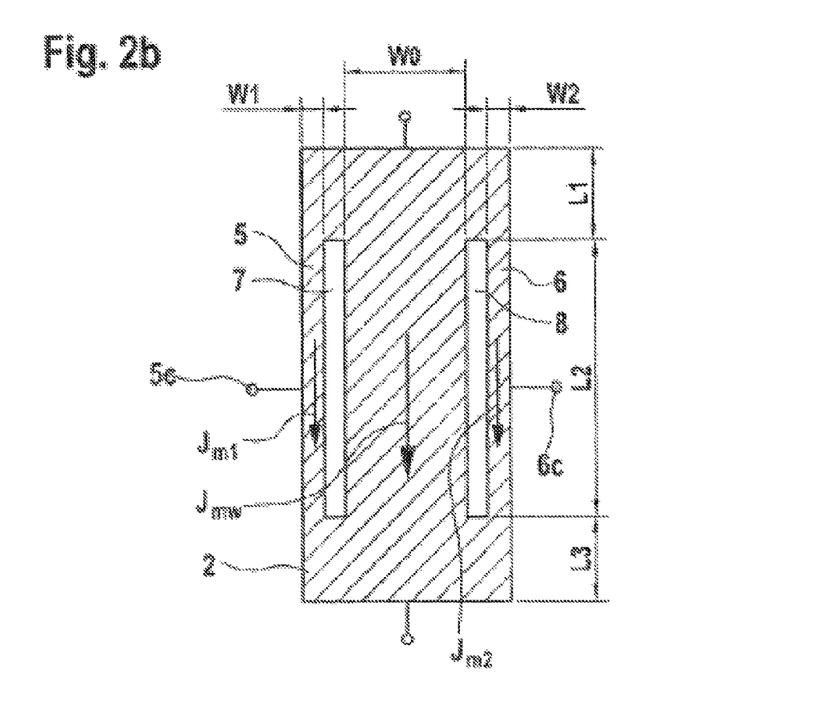
FIG. 2b shows a schematic illustration of a shunt resistor which is used in the system shown in FIG. 2a, according to an example embodiment of the present invention.

FIG. 2b shows a schematic illustration of an example shunt resistor 2 used in system 100 of FIG. 2a. Shunt resistor 2 differs from shunt resistor 2' in FIG. 1b essentially in that slot structures 7 and 8 that extend in the longitudinal direction are introduced into the middle area of shunt resistor 2. The middle area is thus divided into three areas— two side flow areas 5 and 6 as well as a main flow area—which are electrically separated from one another over length L2, transversely with respect to the main flow direction. The main flow area can be of width W0, for example, whereas side flow areas 5 and 6 can be of widths W1 and W2, respectively. In particular, widths W1 and W2 can be equal, and in each case can be significantly smaller than width W0 of the main flow area. Measuring current $J_m$, which flows through shunt resistor 2 along a main flow direction, is divided into three partial currents $J_{m1}$, $J_{mw}$, and $J_{m2}$, where $J_m = J_{m1} + J_{mw} + J_{m2}$. Calibration terminals 5c and 6c are in each case mounted on the two side flow areas 5 and 6, respectively, transversely with respect to the main flow direction. For example, calibration terminals 5c and 6c can each be connected at one-half height, L2/2, of side flow areas 5 and 6, respectively, so that side flow areas 5 and 6 are divided into two current paths which, as shown in FIG. 2*a*, are provided with resistors 5*a* and 5*b*, and 6*a* and 6*b*, respectively.

Of course, it can also be possible for side flow areas 5 and 6 to be situated in a middle area of shunt resistor 2, so that the main flow area includes two main current paths which lead along the edge of shunt resistor 2, while the two current paths of side flow areas 5 and 6 lead along a middle area of shunt resistor 2. The illustration of shunt resistor 2 in FIG. 2*b* is therefore only an example, and, depending on the geometric configuration of the slot structures, can have many different types of designs with shunt resistor 2 being divided into a number of main current paths and two current paths whose resistance is higher than the main current paths.

Figure 3A:
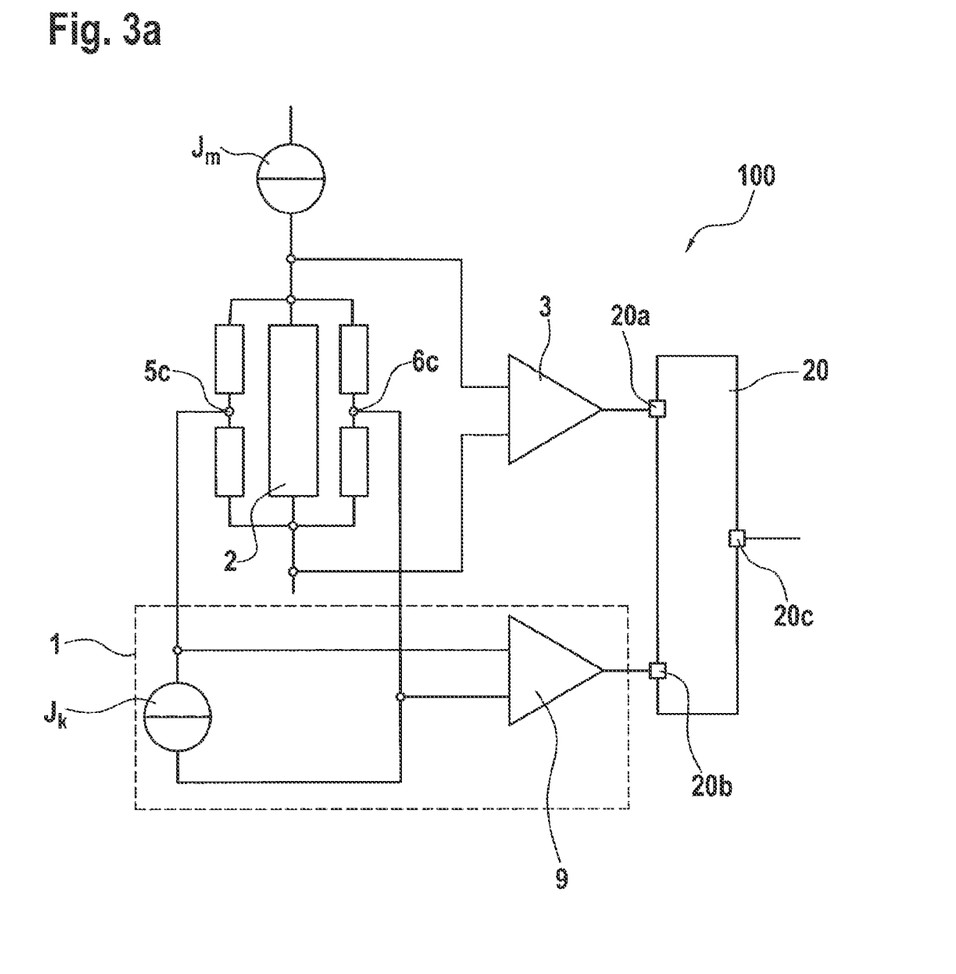
FIG. 3a shows a schematic illustration of a system for detecting a measuring current according to an example embodiment of the present invention.
Figure 3B:
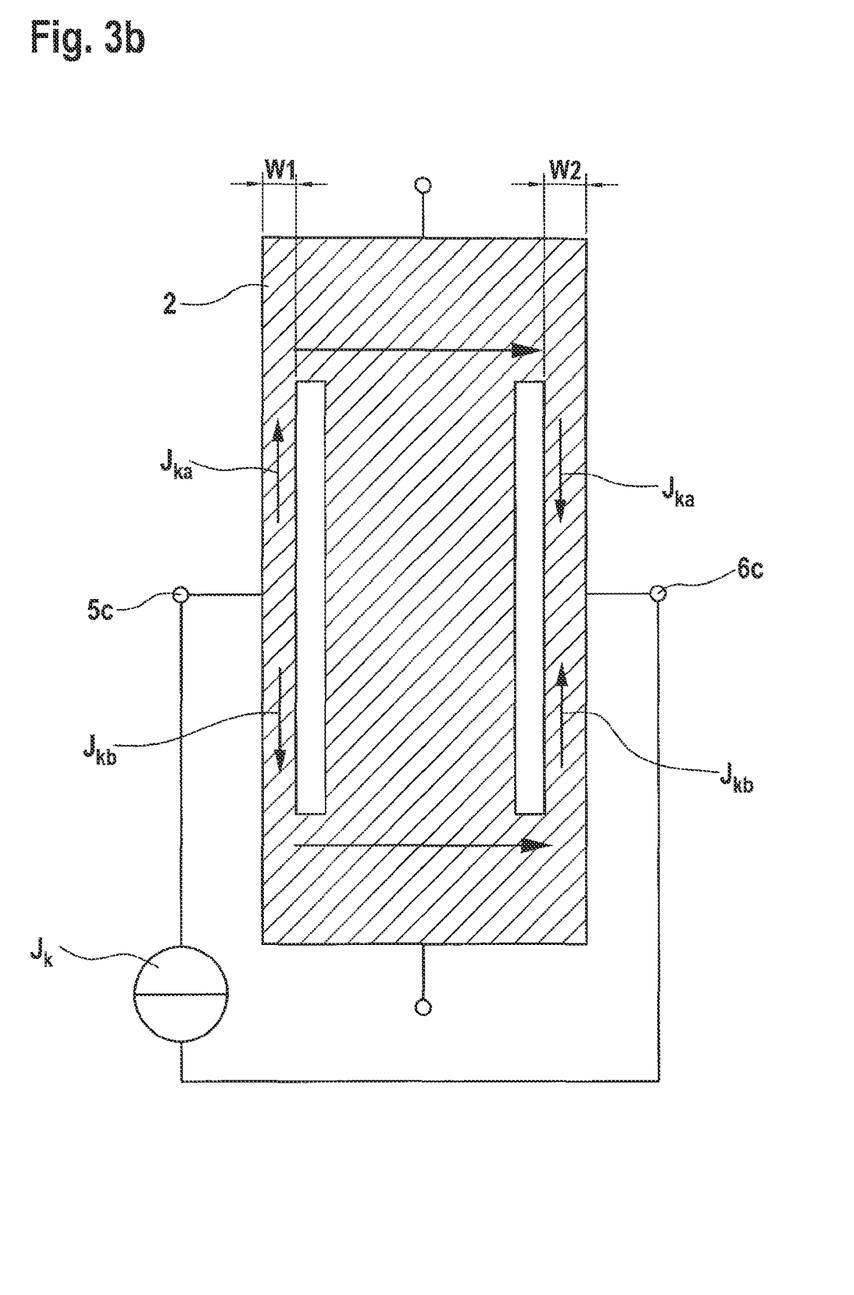
FIG. 3b shows a schematic illustration of a shunt resistor which is used in the system shown in FIG. 3a, according to an example embodiment of the present invention.

FIG. 3*a* shows a schematic illustration of an example system 100 for detecting a measuring current $J_m$. System 100 differs from system 100 in FIG. 2*a* in that a direct current or alternating current source $J_k$ is connected to calibration terminals 5*c* and 6*c* and sends a direct current or alternating current through shunt resistor 2. FIG. 3*b* shows the schematic illustration of shunt resistor 2 from FIGS. 2*a*, 2*b*, and 3*a*, including the source $J_k$. Current $J_k$ from current source $J_k$ enters shunt resistor 2 at calibration terminal 5*c* and is divided over resistors 5*a* and 5*b* into partial currents $J_{ka}$ and $J_{kb}$. Calibration terminals 5*c* and 6*c* can each be connected at one-half the height of the main flow area of shunt resistor 2, so that resistors 5*a* and 5*b*, and 6*a* and 6*b*, are each the same size. In this case, partial currents $J_{ka}$ and $J_{kb}$ are also of the same magnitude, and are each one-half of current $J_k$. Partial currents $J_{ka}$ and $J_{kb}$ flow in the edge areas of shunt resistor 2, in each case transversely with respect to measuring current $J_m$. The resistance with respect to resistors 5*a* and 5*b* or 6*a* and 6*b* is in each case negligible in the edge areas when lengths L1 or L3 of the edge areas is selected to be significantly greater than widths W1 or W2, respectively, of the side flow areas. Partial currents $J_{ka}$ and $J_{kb}$ reunite at calibration terminal 6*c* to once again form current $J_k$. Due to the small widths W1 and W2 of the side flow areas compared to the significantly greater width W0 of the main flow area, the amplitude of current $J_k$ can be selected to be significantly smaller than measuring current $J_m$, so that there is little or no influence on the measuring current. In addition, the measuring-related aging of shunt resistor 2 is minimized due to the impression of current $J_k$, in particular when current $J_k$ is impressed as alternating current.

System 100 shown in FIG. 3*a* includes a calibration device 1 which includes current source $J_k$ and an operational amplifier 9. Operational amplifier 9 is designed to detect the falling voltage across calibration terminals 5*c* and 6*c*. This detected voltage is a function of the resistance values of resistors 5*a*, 5*b*, 6*a*, and 6*b*, which may be subject to material aging. Operational amplifier 9 generates a calibration voltage which can be delivered to a terminal 20*b* of a correction circuit 20. Similarly, the measuring voltage of operational amplifier 3 is delivered to a terminal 20*a* of correction circuit 20, which corrects the measuring voltage to the calibration voltage so that a corrected or calibrated measuring voltage is provided at an output 20*c* of the correction circuit.

The main flow area and side flow areas 5, 6 of shunt resistor 2 are subject to the same aging- and/or temperature-related changes, so that, via the calibration voltage, these influences on shunt resistor 2 can be eliminated in correction circuit 20, and the detection of measuring current $J_m$ can thus be carried out precisely over the entire operating time of shunt resistor 2. The calibration of measuring current $J_m$ can be carried out continuously or cyclically at suitable intervals, for example. It may be advantageous to reverse the polarity of the flow direction of the direct current source at suitable time intervals, i.e., to impress a rectangular current signal so that the current density in the two side flow areas in the middle is exactly the same as the current density in the main flow area, so that the current density-related aging remains constant. In addition, for this purpose it may be advantageous to use an alternating current source instead of a direct current source. Alternatively, it is also be possible to impress current $J_k$ into shunt resistor 2 for only a brief period, for example in pulsed form. The additional current input into shunt resistor 2 can thus be reduced, and the measuring-related changes in the resistance values can be minimized.

Figure 4A:
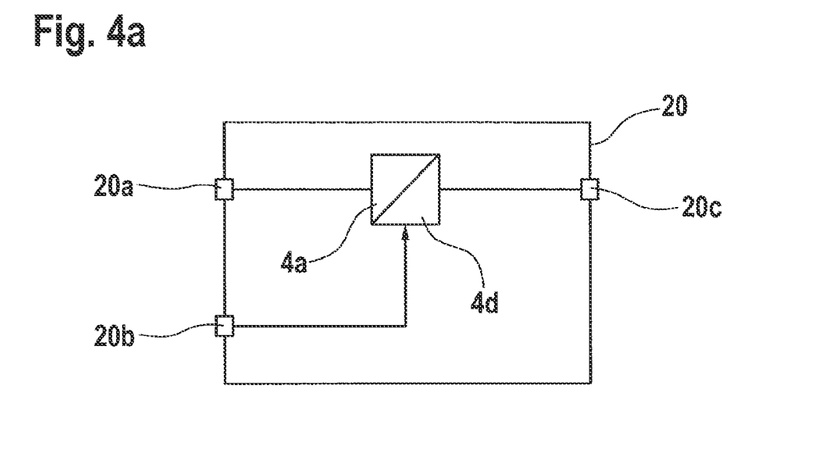
FIG. 4a shows a schematic illustration of a correction circuit according to an example embodiment of the present invention.
Figure 4B:
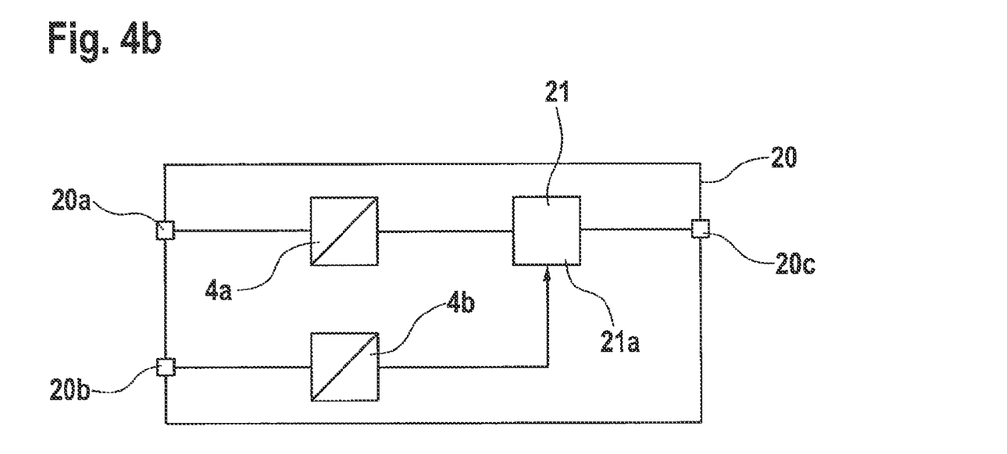
FIG. 4b shows a schematic illustration of a correction circuit according to an example embodiment of the present invention.

FIGS. 4*a* and 4*b* show a schematic illustration of specific example embodiments of correction circuit 20 of FIG. 3*a*. Correction circuit 20 in FIG. 4*a* includes an ADC 4*a* which includes a reference voltage input 4*d*. ADC 4*a* converts the measuring voltage of operational amplifier 3 from analog to digital form, the calibration voltage of operational amplifier 9 being applied as reference voltage to reference voltage input 4*d* of ADC 4*a*. Correction circuit 20 in FIG. 4*b* includes two ADCs 4*a* and 4*b* as well as a digital arithmetic unit. The voltage signals of operational amplifiers 3 and 9 are digitized in ADCs 4*a* and 4*b*, respectively. Digital arithmetic unit 21 includes a reference terminal 21*a* to which the digitized calibration voltage signal of operational amplifier 9 is applied to correct the digital measuring voltage signal of operational amplifier 3 by computation.

One of correction circuits 20 shown in FIGS. 4*a* and 4*b* can also be used in each case for one of correction circuits 20 shown in FIGS. 5, 8, 9, 10*a*, and 10*b*, which are described below.

A reference calibration device can be provided for calibration device 1 in FIG. 3*a*. For this purpose, a reference shunt resistor which is structurally identical to shunt resistor 2 can be connected to a reference direct current source via calibration terminals. A falling reference voltage across the calibration terminals of the reference shunt resistor can then be detected with the aid of a reference operational amplifier. The reference calibration device differs from the calibration device in that measuring current $J_m$ does not flow through the reference shunt resistor, but does flow through shunt resistor 2. The current density-related aging of shunt resistor 2 caused by measuring current $J_m$ can thus be deduced by comparing the reference calibration voltage generated by the reference calibration device to the calibration voltage generated by the calibration device, since all other external influences such as temperature dependency or other influences occur to the same extent in the reference calibration device and in the calibration device.

Figure 5:
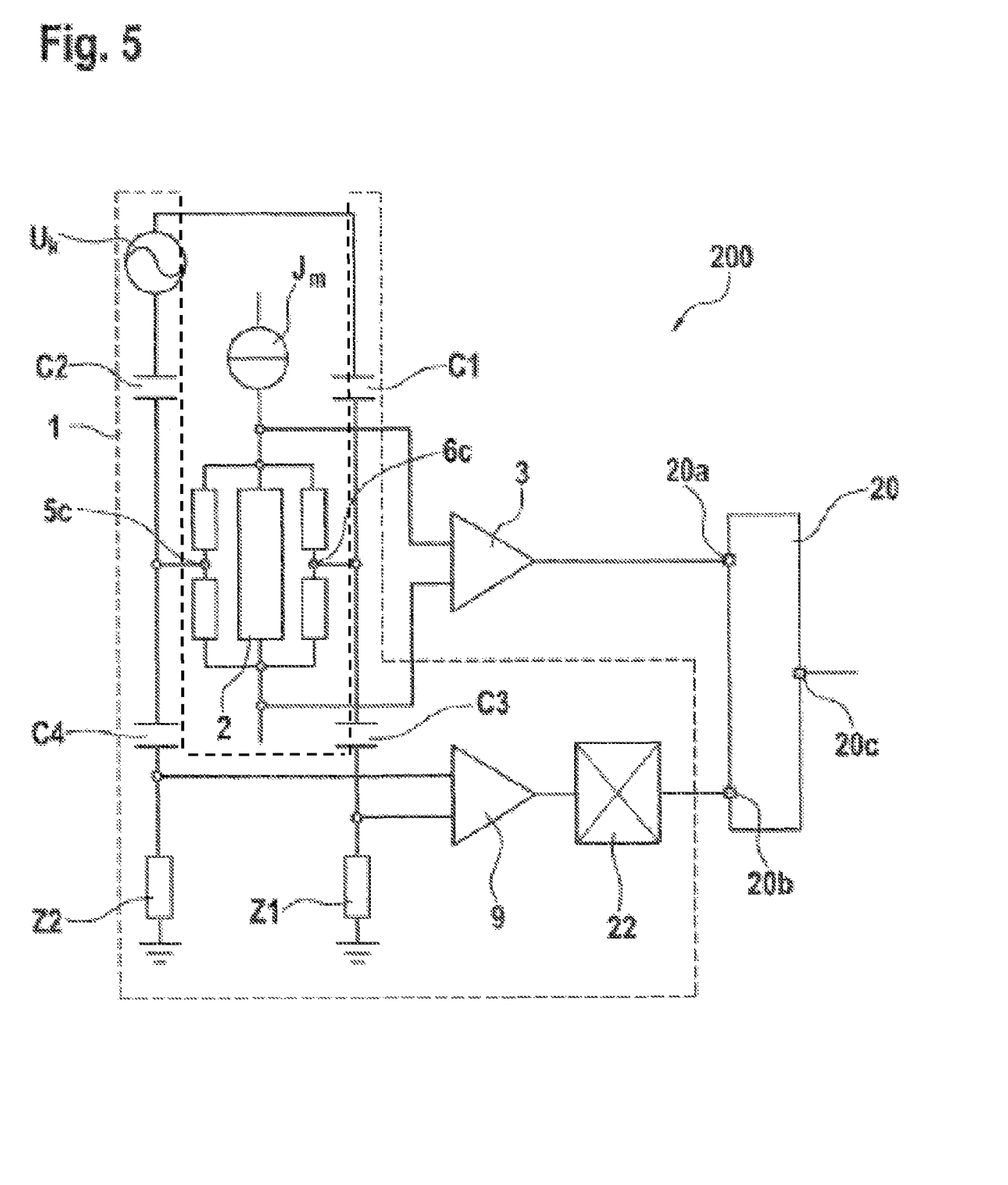
FIG. 5 shows a schematic illustration of a system for detecting a measuring current according to an example embodiment of the present invention.

FIG. 5 shows a schematic illustration of a system 200 for detecting a measuring current. System 200 differs from system 100 in FIGS. 2*a* and 3*a* essentially in that a different calibration device 1 is used. An alternating voltage source $U_k$ is designed to act on one of the two calibration terminals 5*c* and 6*c* with an alternating voltage via capacitors C1 and C2, respectively, so that resistors 5*a* and 5*b*, and 6*a* and 6*b*, together with one of capacitors C2 and C1, respectively, represent a first high pass element for the high-pass filtering of alternating voltage $U_k$ at terminals 5*c* and 6*c*, respectively. Calibration terminals 5*c* and 6*c* are connected to capacitors C4 and C3, respectively. For example, capacitance C of each of capacitors C3 and C4 can be the same as each other, and capacitance $C_k$ of capacitors C1 and C2 can be the same as each other. The amplitude of the alternating voltage present at capacitors C3 and C4 is in each case a function of limiting frequency $f_g$ of first high pass elements ab, which in turn are a function of resistance values $R_k$ of resistors 5a and 5b, and 6a and 6b, according to the following formula: $f_g = (2\pi R_k C_k)^{-1}$.

With the aid of two impedances Z1 and Z2, which are each coupled between a respective one of capacitors C3 and C4 and a respective reference potential, for example, a ground potential, a reference voltage can be tapped between the nodes between capacitors C3 and C4 and impedances Z1 and Z2, respectively, which is detected by operational amplifier 9 in order to generate a calibration voltage.

Capacitors C3 and C4 together with impedances Z1 and Z2 thus in each case form a second high pass element. The limiting frequencies of the second high pass elements are preferably selected to be identical, and applied in such a way that they are lower than limiting frequency $f_g$ of the first high pass elements. It can thus be achieved that the calibration voltage present between terminals 5c and 6c is hardly damped in magnitude; rather, only the input potential on operational amplifier 9 is optimized.

The calibration voltage is a function of limiting frequency $f_g$. If, for example, limiting frequency $f_g$ is selected in such a way that the frequency of alternating voltage $U_k$ is greater than or equal to limiting frequency $f_g$, each increase in resistance in resistors 5a, 5b, 6a, and 6b results in the calibration voltage becoming greater. The calibration voltage of operational amplifier 9 can thus be mixed in a mixer 22 and supplied to correction circuit 20 in order to correct the measuring voltage of operational amplifier 3.

Figure 6:
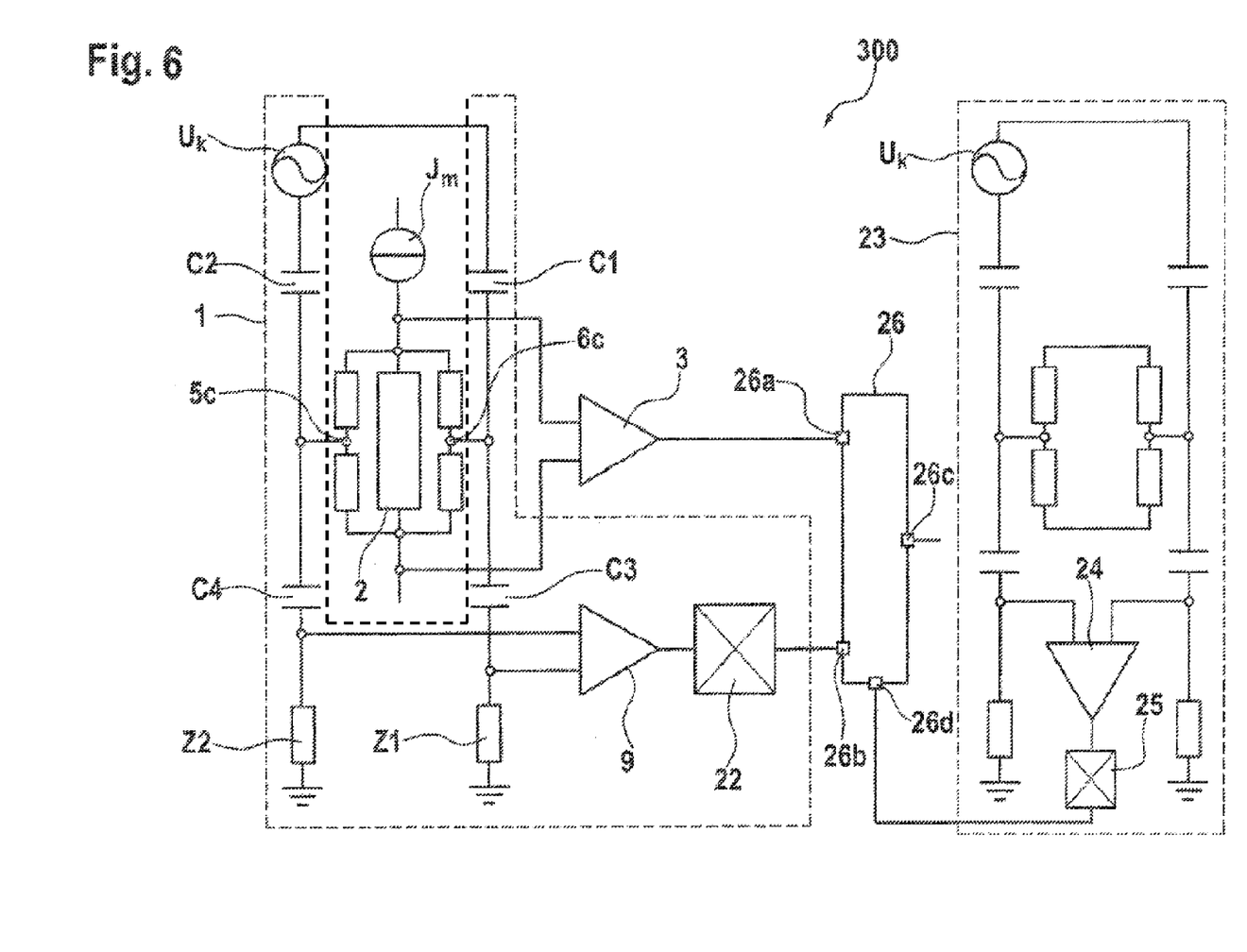
FIG. 6 shows a schematic illustration of a system for detecting a measuring current according to an example embodiment of the present invention.
Figure 7:
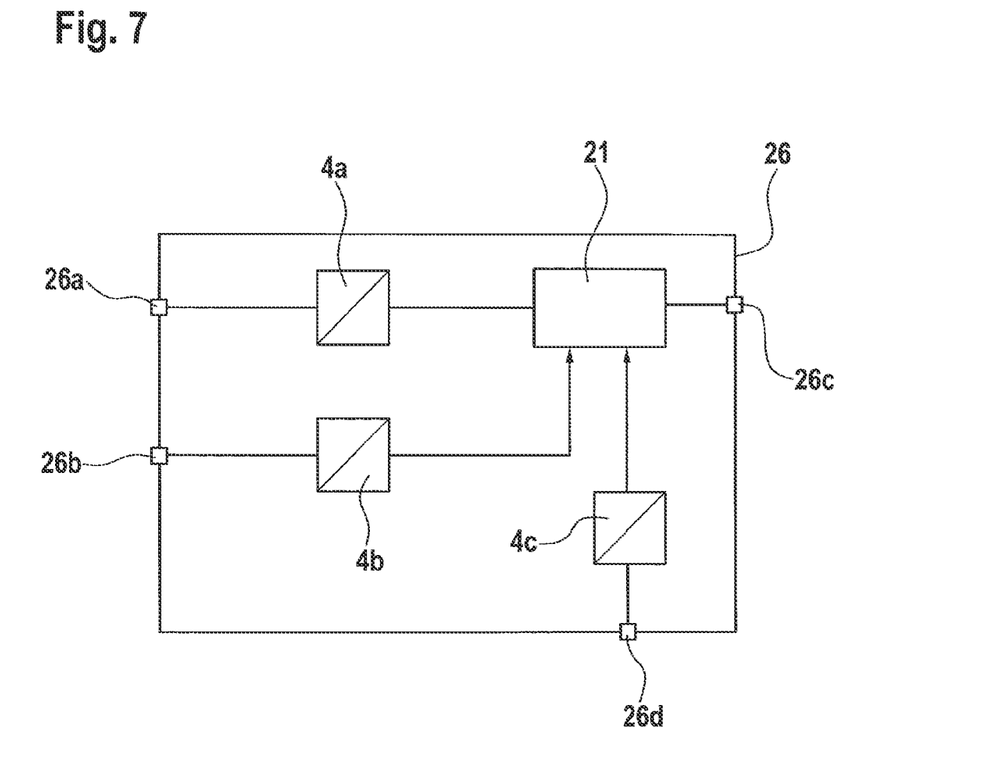
FIG. 7 shows a schematic illustration of a correction circuit according to an example embodiment of the present invention.

FIG. 6 shows a schematic illustration of a system 300 for detecting a measuring current $J_m$. System 300 differs from system 300 in FIG. 5 essentially in that a reference calibration device 23 is provided which includes essentially the same components as calibration device 1. However, a measuring current $J_m$ does not flow through the reference shunt resistor situated in reference calibration device 23. The reference calibration voltage generated by reference operational amplifier 24 is mixed in a reference mixer 25 and transferred to a reference terminal 26d of a correction circuit 26. Correction circuit 26 is shown in greater detail in FIG. 7. Correction circuit 26 differs from correction circuit 20 in FIG. 4b essentially in that a third ADC 4c is provided in which the reference calibration voltage of reference terminal 26d is digitized. In addition to the calibration voltage of the calibration device which is digitized in ADC 4b, the digitized reference calibration voltage is then supplied to digital arithmetic unit 21 to be able to correct the digitized measuring signal of ADC 4a even more precisely.

Figure 8:
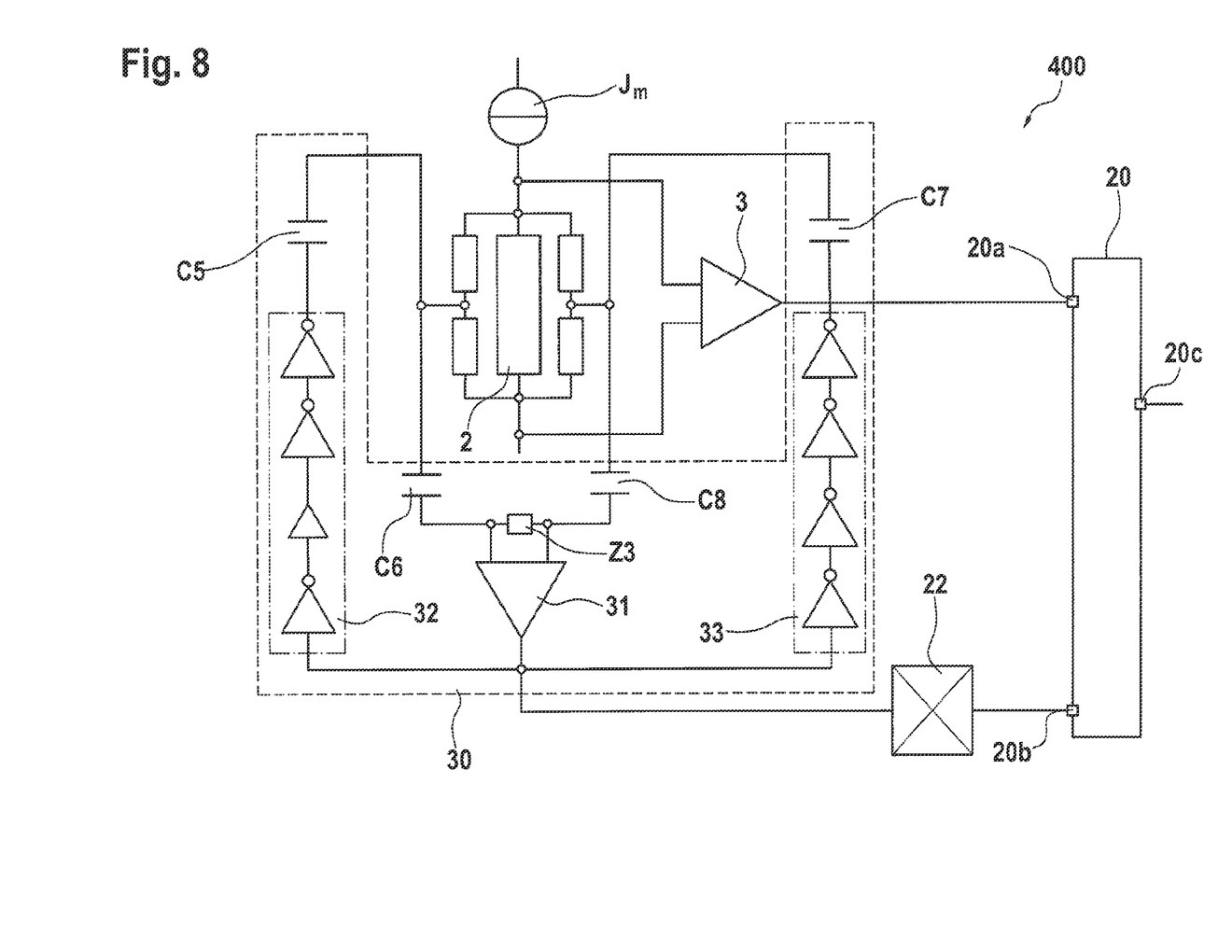
FIG. 8 shows a schematic illustration of a system for detecting a measuring current according to an example embodiment of the present invention.

FIG. 8 shows a schematic illustration of a system 400 for detecting a measuring current $J_m$. System 400 differs from system 100 in FIGS. 2a and 3a and system 200 in FIG. 5 essentially in that a different calibration device 1 is used. Calibration device 1 includes a ring oscillator circuit 30 which is connected to calibration terminals 5c and 6c of shunt resistor 2. Ring oscillator circuit 30 can be built from two loops which are each connected to different calibration terminals 5c and 6c. A first loop includes a first amplifier chain 32, which includes an amplifier and an odd number of inverters, for example three, which are coupled in series to a capacitor C5. A further capacitor C6 is coupled between one of calibration terminals 5c and an input of an operational amplifier 31. A second loop includes a second amplifier chain 33, which includes an even number of inverters, for example four, which are coupled in series to a capacitor C7. A further capacitor C8 is coupled between the other of calibration terminals 6c and the other input of the operational amplifier 31. Both loops are coupled across the inputs of operational amplifier 31 via an impedance Z3. The oscillation frequency of ring oscillator 30 is a function, among other factors, of the resistance values of resistors 5a, 5b, 6a, and 6b, so that a voltage that is present at the output of operational amplifier 31 has an alternating voltage frequency which changes with the resistance values of resistors 5a, 5b, 6a, and 6b. The output voltage of ring oscillator 30 can thus be mixed in a mixer 22 and transferred as calibration voltage to terminal 20b of a correction circuit 20.

Figure 9:
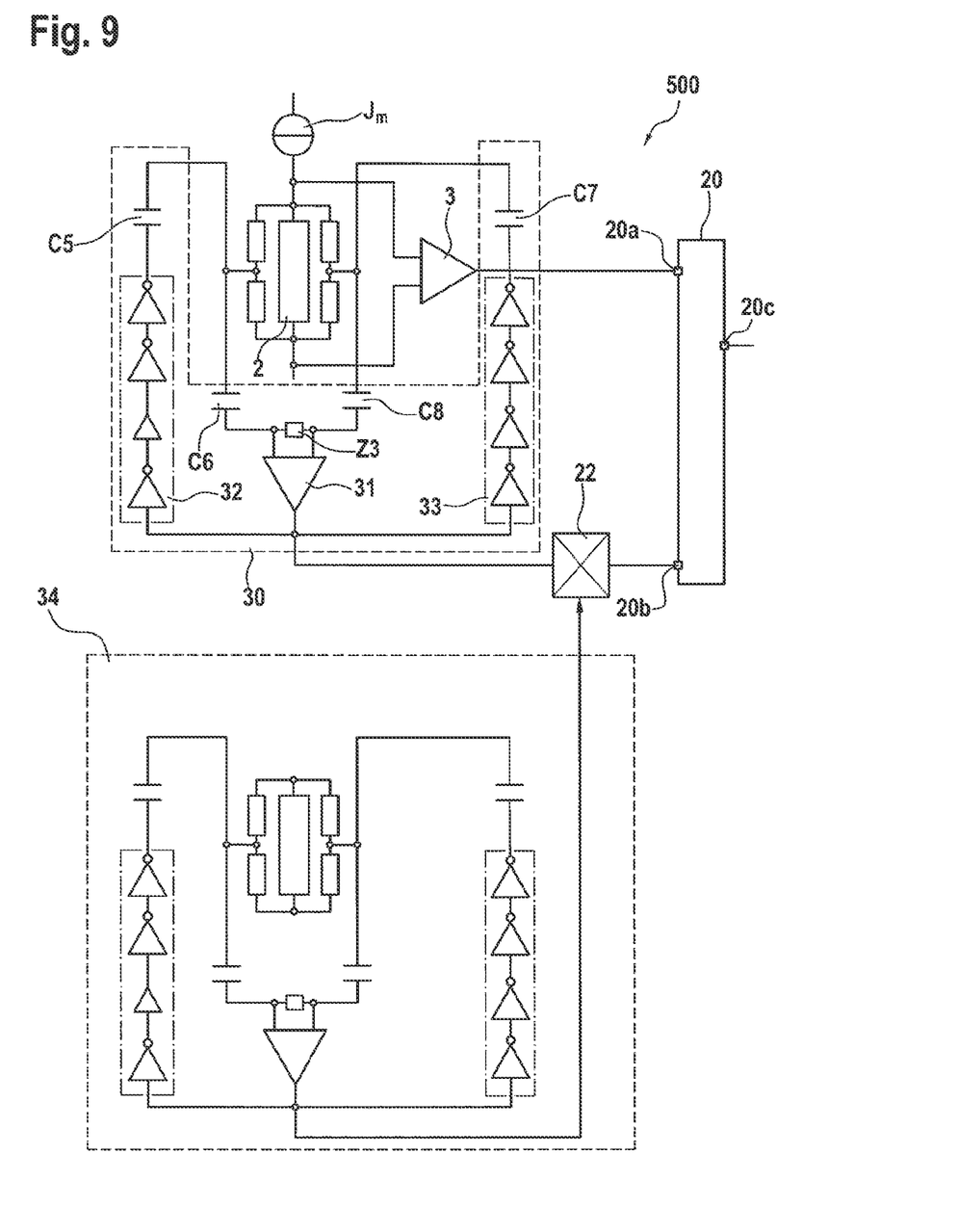
FIG. 9 shows a schematic illustration of a system for detecting a measuring current according to an example embodiment of the present invention.

FIG. 9 shows a schematic illustration of a system 500 for detecting a measuring current $J_m$. System 500 differs from system 400 in FIG. 8 in that a reference ring oscillator 34 is provided which generates a reference calibration voltage which can be mixed together with the calibration voltage of ring oscillator 30 in mixer 22.

Figure 10A:
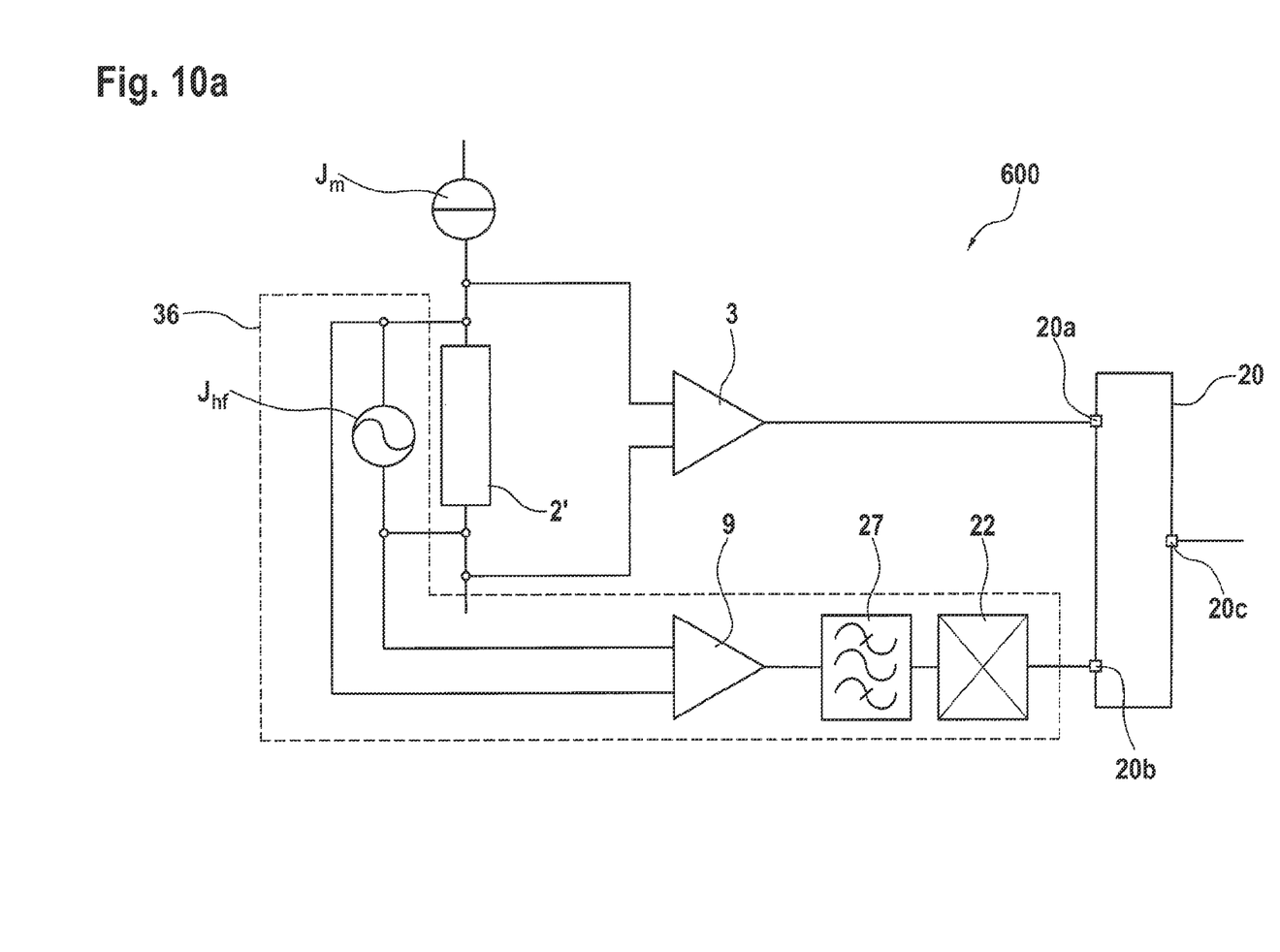
FIG. 10a shows a schematic illustration of a system for detecting a measuring current according to an example embodiment of the present invention.

FIG. 10a shows a schematic illustration of a system 600 for detecting a measuring current $J_m$. System 600 includes a shunt resistor 2' which can have the design of shunt resistor 2' in FIG. 1b. A measuring current $J_m$ is supplied to shunt resistor 2' via measuring terminals 2a and 2b, and the voltage caused by measuring current $J_m$ via shunt resistor 2' is detected via an operational amplifier 3. In addition to measuring current $J_m$, a high-frequency alternating current, by an alternating current source $J_{hf}$ in a calibration device 36, is impressed into shunt resistor 2' via measuring terminals 2a and 2b. Alternating current $J_{hf}$ can have a significantly higher frequency and a significantly lower amplitude compared to measuring current $J_m$. The falling voltage of shunt resistor 2' across measuring terminals 2a and 2b is likewise ascertained via an operational amplifier 9. The measuring voltage which is output by operational amplifier 9 is supplied to a band pass filter 27, a band pass frequency of which is tuned to the frequency of alternating current $J_{hf}$. Band pass filter 27 preferably has a very small bandwidth and/or a very high filter quality. The smaller the bandwidth of band pass filter 27, the smaller the amplitude of alternating current $J_{hf}$ that may be selected. The output voltage of operational amplifier 9 which is filtered by band pass filter 27 thus relays the voltage component, caused by alternating current $J_{hf}$, of the falling total voltage across shunt resistor 2'. The changes in this voltage component can in turn be used in a correction circuit 20 for calibrating the measuring voltage ascertained by operational amplifier 3.

Figure 10B:
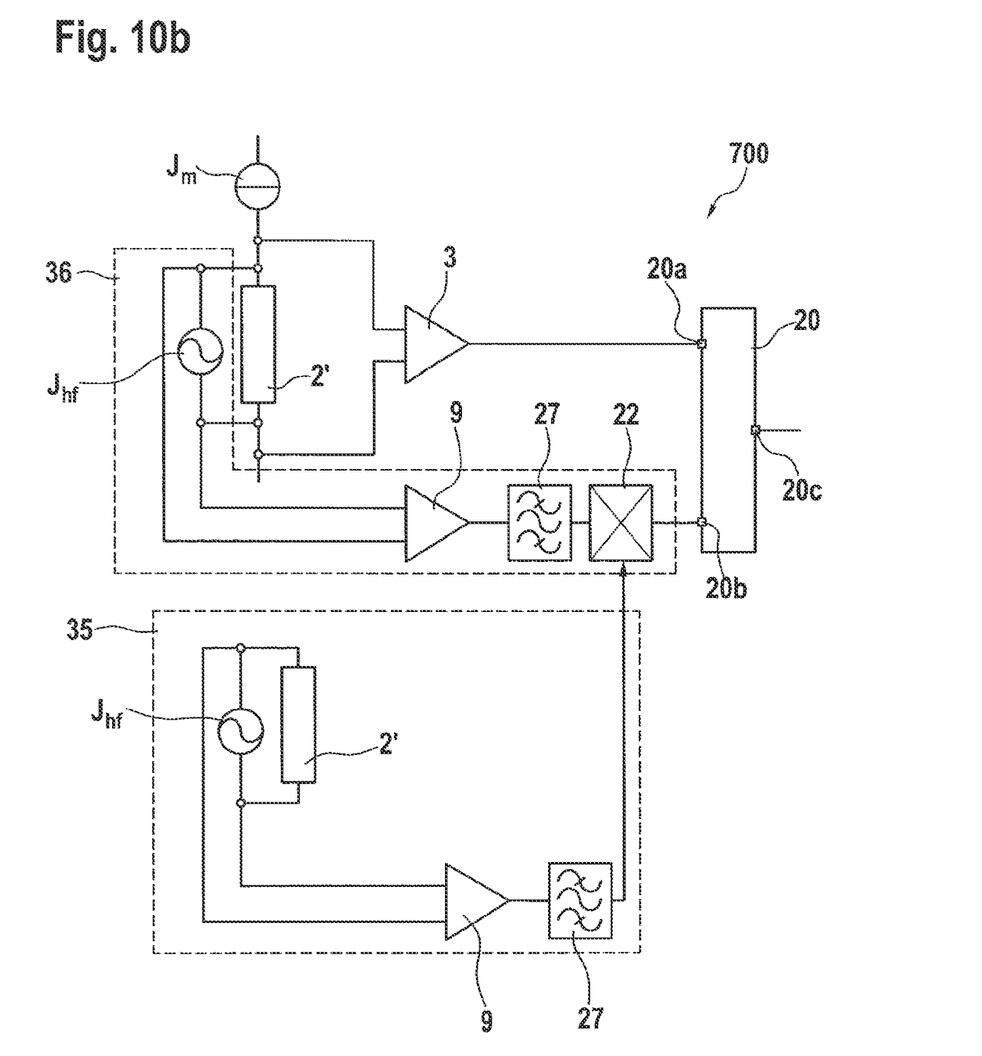
FIG. 10b shows a schematic illustration of a system for detecting a measuring current according to an example embodiment of the present invention.

FIG. 10b shows a schematic illustration of a system 700 for detecting a measuring current $J_m$. System 700 differs from system 600 in FIG. 10a in that a reference calibration device 35 is provided which generates a reference calibration voltage which together with the calibration voltage of calibration device 36 can be mixed in mixer 22.

What is claimed is:

1. A shunt resistor, comprising:
   two measuring terminals configured for application of a measuring current that flows through the shunt resistor along a main flow direction;
   slots that divide the shunt resistor along the main flow direction into (a) two side flow areas of respective first widths and (b) a main flow area of a second width, the flow of the measuring current being divided into three parallel flows, including respective flows in each of the two side flow areas and the main flow area; and
   two calibration terminals that are connected to the side flow areas transversely with respect to the main flow direction.

2. The shunt resistor of claim 1, wherein the second width is larger than each of the first widths, and the side flow areas and the main flow area are made of a same material.

3. A system for detecting a measuring current, comprising:
- a shunt resistor that includes:
  - two measuring terminals configured for application of a measuring current that flows through the shunt resistor along a main flow direction;
  - slot structures that divide the shunt resistor along the main flow direction into (a) two side flow areas of respective first widths and (b) a main flow area of a second width; and
  - two calibration terminals that are connected to the side flow areas transversely with respect to the main flow direction;
- a detection circuit that is:
  - connected to the measuring terminals of the shunt resistor;
  - configured to detect the measuring current flowing through the shunt resistor; and
  - configured to generate a measuring signal as a function of the detected measuring current;
- a calibration device that is:
  - connected to the calibration terminals;
  - configured to apply one of a reference voltage and a reference current to the two calibration terminals; and
  - configured to ascertain a calibration voltage as a function of a falling voltage across the two calibration terminals; and
- a correction circuit that is:
  - connected to the calibration device and the detection circuit; and
  - configured to correct the measuring signal generated by the detection circuit as a function of the ascertained calibration voltage.

4. The system of claim 3, wherein the calibration device includes:
- a source of one of a direct current and an alternating current, the source being connected to the calibration terminals of the shunt resistor; and
- an operational amplifier configured to:
  - detect one of a falling direct voltage and a falling alternating voltage across the calibration terminals; and
  - ascertain the calibration voltage from the detected one of the falling direct voltage and the falling alternating voltage.

5. The system of claim 4, further comprising:
- a reference shunt resistor that is structurally identical to the shunt resistor and through which no measuring current flows;
- a reference calibration device including a reference current source, which reference current source is connected to the calibration terminals of the reference shunt resistor; and
- a reference operational amplifier configured to detect, and generate a reference calibration voltage based on, a falling voltage across the calibration terminals of the reference shunt resistor, wherein the correction circuit is connected to the reference calibration device and is designed to normalize the ascertained calibration voltage to the reference calibration voltage.

6. The system of claim 3, wherein the calibration device includes:
- an alternating voltage source configured to act on the calibration terminals with a reference alternating voltage;
- two capacitors which are each connected to a respective one of the two calibration terminals;
- two resistors which are each coupled between a respective one of the two capacitors and a respective ground terminal; and
- an operational amplifier configured to tap a voltage difference between two nodes and ascertain the calibration voltage from the tapped voltage difference, each of the two nodes being between a respective one of the two capacitors and a respective one of the two resistors.

7. The system of claim 6, further comprising:
- a reference shunt resistor which is structurally identical to the shunt resistor and through which no measuring current flows;
- a reference calibration device including a reference alternating voltage source which is connected to the calibration terminals of the reference shunt resistor;
- two reference capacitors which are each connected to a respective one of the two calibration terminals of the reference shunt resistor;
- two reference resistors which are each coupled between a respective one of the two reference capacitors and a respective ground terminal; and
- a reference operational amplifier configured to tap a reference voltage difference between two reference nodes and generate a reference calibration voltage from the tapped reference voltage difference;
- wherein:
  - each of the two reference nodes is arranged between a respective one of the two reference capacitors and a respective one of the two reference resistors; and
  - the correction circuit is connected to the reference calibration device and is configured to normalize the ascertained calibration voltage to the reference calibration voltage.

8. The system of claim 3, wherein the calibration device includes:
- a ring oscillator that is connected to the calibration terminals, and that is configured to generate a calibration voltage (a) which includes an alternating voltage and (b) whose frequency is a function of the resistance in the side flow areas of the shunt resistor.

9. A method for detecting a measuring current using a shunt resistor, the shunt resistor including (a) two measuring terminals configured for application of the measuring current which flows through the shunt resistor along a main flow direction, (b) slot structures which divide the shunt resistor along the main flow direction into (I) two side flow areas of respective first widths and (II) a main flow area of a second width, and (c) two calibration terminals that are connected to the side flow areas transversely with respect to the main flow direction, the method comprising:
- detecting the measuring current flowing through the shunt resistor;
- generating a measuring signal as a function of the detected measuring current;
- applying one of a reference voltage and a reference current to the calibration terminals of the shunt resistor;
- detecting a falling voltage across the two calibration terminals;
- generating a calibration voltage from the falling voltage across the two calibration terminals; and
- correcting the measuring signal as a function of the calibration voltage for ascertaining a corrected measuring current through the shunt resistor.

10. The shunt resistor of claim 1, wherein, for each of the two side flow areas, the respective side flow area extends from a first respective end of the respective side flow area, at which the respective side flow area is connected to the main flow area, to a second end of the respective side flow area, at which the respective side flow area is connected to the main flow area.

* * * * *